United States Patent
Fujii

(10) Patent No.: US 9,054,039 B2
(45) Date of Patent: Jun. 9, 2015

(54) SEMICONDUCTOR DEVICE

(71) Applicant: Mitsubishi Electric Corporation, Chiyoda-ku (JP)

(72) Inventor: Hidenori Fujii, Tokyo (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 14/447,045

(22) Filed: Jul. 30, 2014

(65) Prior Publication Data

US 2014/0339674 A1  Nov. 20, 2014

Related U.S. Application Data

(62) Division of application No. 13/237,516, filed on Sep. 20, 2011, now Pat. No. 8,872,346.

(30) Foreign Application Priority Data

Mar. 25, 2011 (JP) ................................ 2011-068214

(51) Int. Cl.
| | |
|---|---|
| *H01L 23/52* | (2006.01) |
| *H01L 23/29* | (2006.01) |
| *H01L 23/31* | (2006.01) |

(52) U.S. Cl.
CPC .......... *H01L 23/291* (2013.01); *H01L 23/3157* (2013.01); *H01L 2924/0002* (2013.01)

(58) Field of Classification Search
CPC ................. H01L 2924/00; H01L 2224/48227; H01L 21/0254; H01L 23/291; H01L 23/3157; H01L 2924/0002

USPC ......... 257/503, 636, 646, 490, 494, 640, 774, 257/E23.01, E21.591, E23.144, E21.627, 257/E21.641, E21.151, E29.015

See application file for complete search history.

(56) References Cited

U.S. PATENT DOCUMENTS

| | | | |
|---|---|---|---|
| H665 H | 8/1989 | Knolle et al. | |
| 5,677,562 A * | 10/1997 | Korwin-Pawlowski et al. ............................ | 257/490 |
| 5,905,277 A | 5/1999 | Ota et al. | |

(Continued)

FOREIGN PATENT DOCUMENTS

| | | |
|---|---|---|
| JP | 5-55380 | 3/1993 |
| JP | 7-326744 | 12/1995 |

(Continued)

OTHER PUBLICATIONS

Office Action issued on Jul. 21, 2014 in the corresponding German Patent Application No. 10 2011 122 927.6 (with English Translation).

(Continued)

*Primary Examiner* — Cuong Q Nguyen
*Assistant Examiner* — Yosef Gebreyesus
(74) *Attorney, Agent, or Firm* — Oblon, McClelland, Maier & Neustadt, L.L.P.

(57) ABSTRACT

A semiconductor device includes: a substrate; a lower wiring on the substrate; an inter-layer insulating film covering the lower wiring; first and second upper wirings on the inter-layer insulating film and separated from each other; and a semi-insulating protective film covering the first and second upper wirings, wherein the protective film is not provided in a region right above the lower wiring and between the first upper wiring and the second upper wiring.

5 Claims, 6 Drawing Sheets

(56) References Cited

U.S. PATENT DOCUMENTS

| | | | |
|---|---|---|---|
| 5,945,692 A | 8/1999 | Yano et al. | |
| 5,949,113 A * | 9/1999 | Ota et al. | 257/380 |
| 6,054,748 A * | 4/2000 | Tsukuda et al. | 257/496 |
| 6,225,651 B1 | 5/2001 | Billon | |
| 6,370,965 B1 | 4/2002 | Knapp | |
| 6,458,620 B1 | 10/2002 | Matsuda | |
| 6,542,525 B1 * | 4/2003 | Matsumoto et al. | 372/26 |
| RE41,866 E * | 10/2010 | Yano et al. | 257/139 |
| 2002/0003311 A1 * | 1/2002 | Uematsu | 257/903 |
| 2002/0025597 A1 | 2/2002 | Matsuda | |
| 2005/0127437 A1 | 6/2005 | Inagawa et al. | |
| 2006/0113536 A1 * | 6/2006 | Kumomi et al. | 257/57 |
| 2006/0211227 A1 | 9/2006 | Chen et al. | |
| 2008/0012089 A1 | 1/2008 | Moreno et al. | |
| 2008/0116454 A1 | 5/2008 | Shimizu | |
| 2010/0052047 A1 * | 3/2010 | Schmidt | 257/330 |
| 2010/0252904 A1 * | 10/2010 | Takahashi et al. | 257/492 |
| 2011/0049562 A1 | 3/2011 | Suzuki et al. | |

FOREIGN PATENT DOCUMENTS

| | | |
|---|---|---|
| JP | 10-32203 A | 2/1998 |
| JP | 2002-231943 A | 8/2002 |
| JP | 2008-294157 | 12/2008 |
| JP | 2009-152334 A | 7/2009 |
| JP | 2011-49393 A | 3/2011 |
| KR | 10-2002-0009440 A | 2/2002 |
| KR | 10-2004-0079677 A | 9/2004 |

OTHER PUBLICATIONS

Japanese Office Action issued Apr. 1, 2014 in Patent Application No. 2011-068214 with Partial English Translation.

Office Action issued Feb. 8, 2013 in Korean Patent Application No. 10-2012-0015657 (with partial English-language translation).

German Office Action issued Jul. 19, 2012 in Patent Application No. 10 2011 090 118.3 with English Translation.

Chinese Office Action issued in Patent Application No. 201210045372 issued on May 14, 2014 (with partial English language translation).

Office Action issued Jan. 28, 2015 in Chinese Patent Application No. 201210045372.7 (with English translation).

* cited by examiner

US 9,054,039 B2

SEMICONDUCTOR DEVICE

This divisional application claims the benefit of priority under 35 U.S.C. §120 from prior U.S. patent application Ser. No. 13/237,516, filed on Sep. 20, 2011. This application is also based upon and claims the benefit of priority under 35 U.S.C. §119 from prior Japanese Patent Application No. 2011-068214, filed on Mar. 25, 2011 in Japan. The entire contents of each of these applications are incorporated herein by reference.

BACKGROUND OF THE INVENTION

1. Field of the Invention

The present invention relates to a semiconductor device which can improve insulation resistance.

2. Background Art

A semiconductor device is available which includes a lower wiring covered with an inter-layer insulating film and an upper wiring placed thereon. On the surface of such a semiconductor device, a region other than a wire-bonded pad is covered with a semi-insulating protective film (e.g., see Japanese Patent Laid-Open No. 7-326744).

SUMMARY OF THE INVENTION

In the region where the upper wiring is etched, part of the inter-layer insulating film is also etched and thinned. Furthermore, the inter-layer insulating film is thinned in a stepped part of the lower wiring. Such a region with a thin inter-layer insulating film involves a problem that a leakage current flows via the semi-insulating protective film between the lower wiring and the upper wiring where a potential difference is produced, producing ESD (electrostatic discharge) destruction.

In view of the above-described problems, an object of the present invention is to provide a semiconductor device which can improve insulation resistance.

According to the present invention, a semiconductor device includes: a substrate; a lower wiring on the substrate; an inter-layer insulating film covering the lower wiring; first and second upper wirings on the inter-layer insulating film and separated from each other; and a semi-insulating protective film covering the first and second upper wirings, wherein the protective film is not provided in a region right above the lower wiring and between the first upper wiring and the second upper wiring.

The present invention makes it possible to improve insulation resistance.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
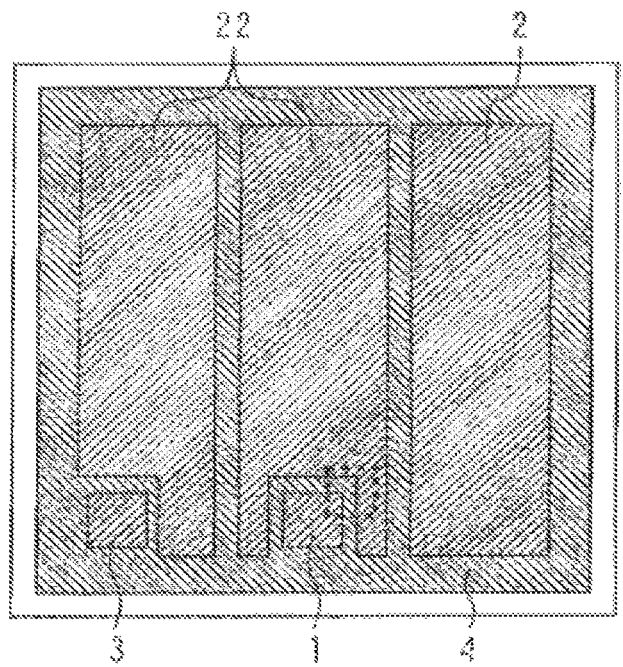
FIG. 1 is a top view illustrating a semiconductor device according to a first embodiment of the present invention.

FIG. 1 is a top view illustrating a semiconductor device according to a first embodiment of the present invention. A gate pad 1, an emitter pad 2 and a sense pad 3 connected to a current temperature sensor (not shown), which are wire-bonded, are provided on a chip. The rest of the region other than these pads is covered with a protective film 4.

The protective film 4 has a semi-insulating SInSiN film (refractive index: 2.2 to 2.7) having a film thickness of 2000 Å to 10000 Å and an insulating film (refractive index: 1.8 to 2.2) having a film thickness of 2000 Å to 10000 Å provided thereon to stabilize the withstand voltage and prevent polarization. A semi-insulating polysilicon (SIPOS: Semi-Insulating Polycrystalline Silicon) or the like may also be used instead of the SInSiN film.

Figure 2:
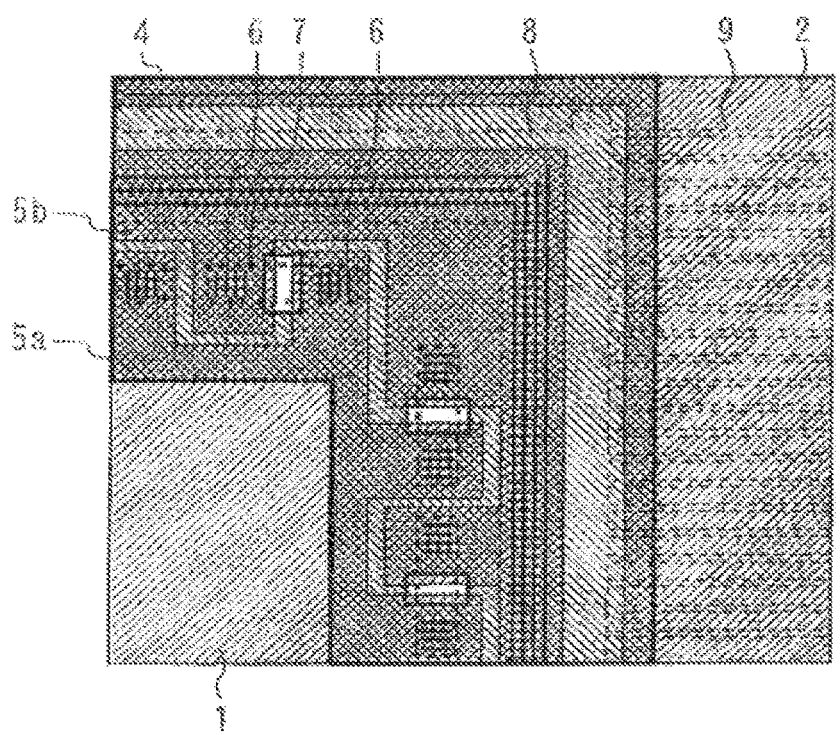
FIG. 2 is an enlarged top view of the portion enclosed by a broken line in FIG. 1.

FIG. 2 is an enlarged top view of the portion enclosed by a broken line in FIG. 1. Aluminum wirings 5a and 5b separated from each other are connected at both ends of a gate resistor 7 via a contact electrode 6. Part of the aluminum wiring 5a exposed from an opening of the protective film 4 constitutes the gate pad 1. The aluminum wiring 5b is connected to a gate wiring 8. The gate wiring 8 is connected to a trench gate 9 provided below the emitter pad 2.

Figure 3:
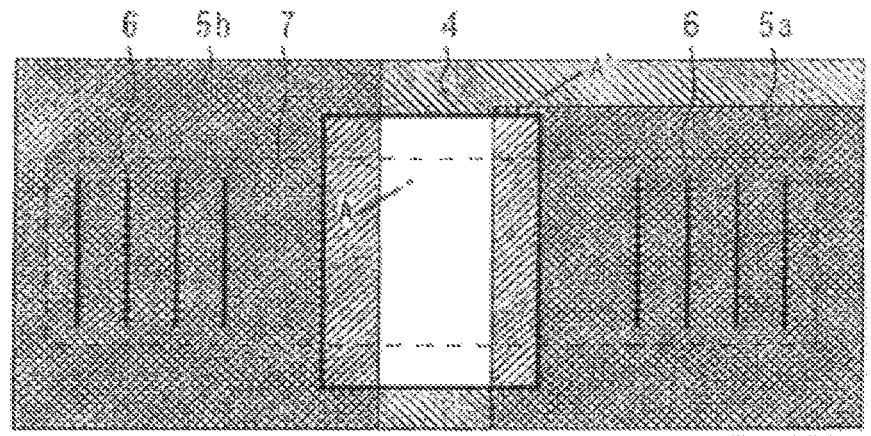
FIG. 3 is a partially enlarged top view of FIG. 2.
Figure 4:
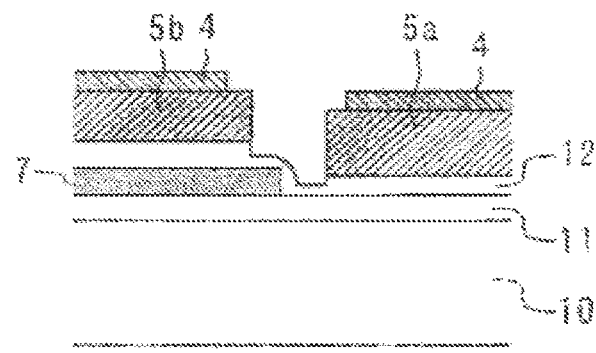
FIG. 4 is a cross-sectional view along A-A' of FIG. 3.

FIG. 3 is a partially enlarged top view of FIG. 2. FIG. 4 is a cross-sectional view along A-A' of FIG. 3. A gate oxide film 11 having a film thickness of 2000 Å to 10000 Å is provided on a Si substrate 10 and a gate resistor 7 made up of doped polysilicon having a film thickness of 500 Å to 5000 Å is provided thereon. The gate resistor 7 is covered with an inter-layer insulating film 12 made up of an oxide film having a film thickness of 2000 Å to 10000 Å. The inter-layer insulating film 12 is etched at both ends of the gate resistor 7 and the contact electrode 6 made of tungsten or the like is embedded. The inter-layer insulating film 12 is deposited through CVD (Chemical Vapor Deposition) and becomes thinner at the stepped part of the gate resistor 7.

The aluminum wirings 5a and 5b having a film thickness of 1 μm to 10 μm, which are separated from each other, are provided on the inter-layer insulating film 12. The aluminum wirings 5a and 5b are formed by forming an aluminum film through vapor deposition or sputtering and then etching the aluminum film. The aluminum wirings 5a and 5b are covered with the semi-insulating protective film 4. However, the semi-insulating protective film 4 is not provided in a region right above the gate resistor 7 and between the aluminum wiring 5a and the aluminum wiring 5b.

Figure 5:
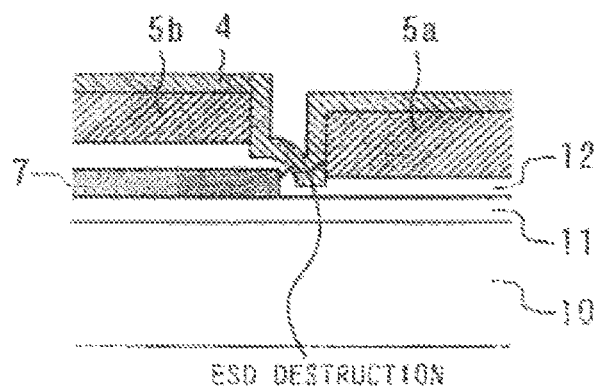
FIG. 5 is a cross-sectional view illustrating a semiconductor device according to the comparative example.

Next, effects of the present embodiment will be described in comparison with a comparative example. FIG. 5 is a cross-sectional view illustrating a semiconductor device according to the comparative example. In the comparative example, the semi-insulating protective film 4 is provided in a region right above the gate resistor 7 and between the aluminum wiring 5a and the aluminum wiring 5b. However, when the aluminum wirings 5a and 5b are etched, part of the inter-layer insulating film 12 is also etched and thinned in this region. For this reason, in the comparative example, a leakage current flows via the semi-insulating protective film 4 between the gate resistor 7 and the aluminum wirings 5a and 5b where a potential difference is produced, producing ESD destruction.

On the other hand, the present embodiment does not provide the semi-insulating protective film 4 in the region right above the gate resistor 7 and between the aluminum wiring 5a and the aluminum wiring 5b. This makes it possible to extend the insulation distance between the gate resistor 7 and the aluminum wirings 5a and 5b, and thereby prevent ESD destruction. Thus, insulation resistance can be improved.

Figure 6:
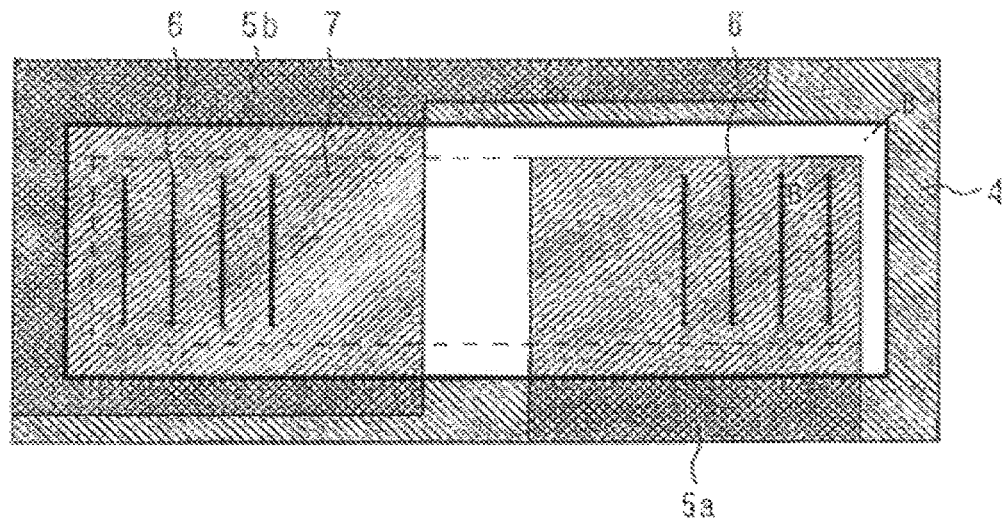
FIG. 6 is a top view illustrating a modification example of the semiconductor device according to the first embodiment of the present invention.
Figure 7:
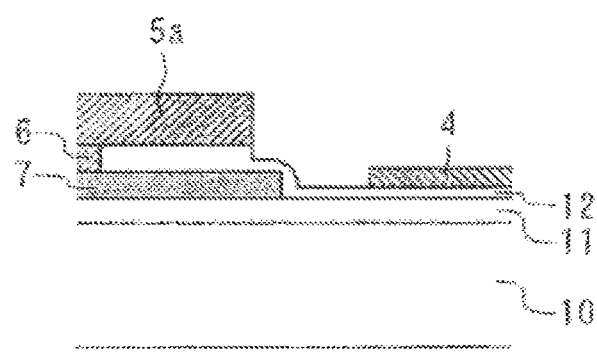
FIG. 7 is a cross-sectional view along B-B' in FIG. 6.

FIG. 6 is a top view illustrating a modification example of the semiconductor device according to the first embodiment of the present invention. FIG. 7 is a cross-sectional view along B-B' in FIG. 6. The protective film 4 is not provided in the entire region right above the gate resistor 7. This makes it possible to further improve insulation resistance.

Second Embodiment

Figure 8:
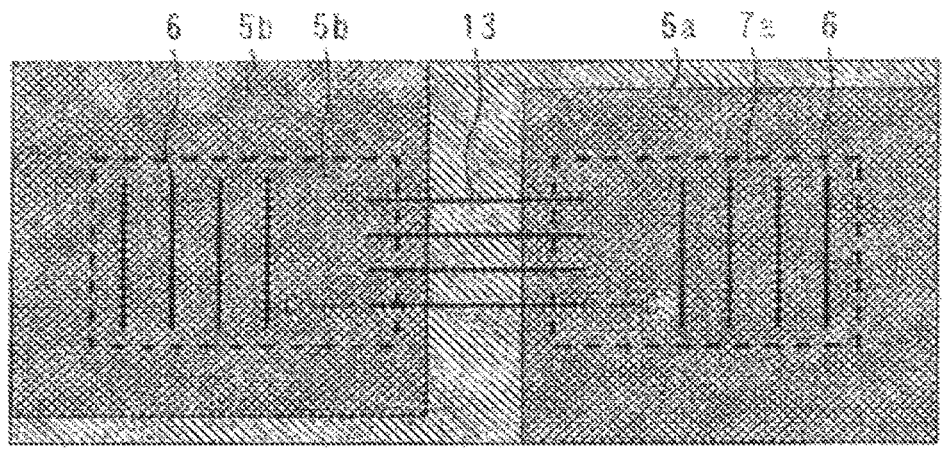
FIG. 8 is a top view illustrating a semiconductor device according to a second embodiment of the present invention.
Figure 9:
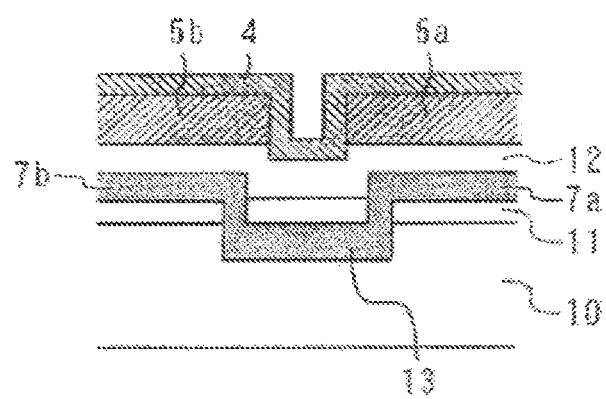
FIG. 9 is a cross-sectional view along C-C' in FIG. 8.

FIG. 8 is a top view illustrating a semiconductor device according to a second embodiment of the present invention. FIG. 9 is a cross-sectional view along C-C' in FIG. 8. Gate resistors 7a and 7b are provided on a Si substrate 10. The gate resistors 7a and 7b are covered with an inter-layer insulating film 12. Aluminum wirings 5a and 5b are provided on the inter-layer insulating film 12. The aluminum wirings 5a and 5b are separated from each other and connected to the gate resistors 7a and 7b respectively via a contact electrode 6. The aluminum wirings 5a and 5b are covered with a semi-insulating protective film 4.

A trench wiring 13 is provided on the Si substrate 10 below a region between the aluminum wiring 5a and the aluminum wiring 5b. The trench wiring 13 connects the gate resistor 7a and the gate resistor 7b. The trench wiring 13 is formed by etching the Si substrate 10 by several μm to form a trench, oxidizing the side wall thereof to form an oxide film having a film thickness of 100 Å to 2000 Å and then embedding doped polysilicon.

The trench wiring 13 can extend the insulation distance between the gate resistors 7a and 7b, and the aluminum wirings 5a and 5b, and can thereby prevent ESD destruction. Therefore, insulation resistance can be improved.

Figure 10:
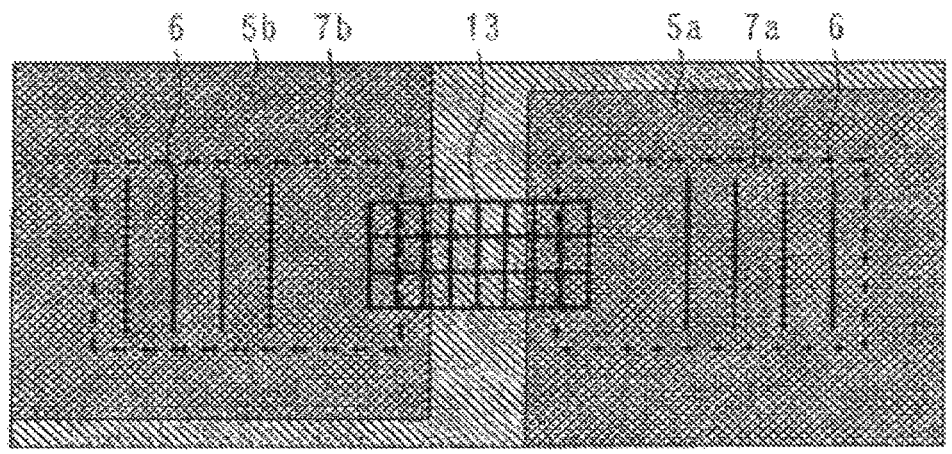
FIG. 10 is a top view illustrating a modification example of the semiconductor device according to the second embodiment of the present invention.

FIG. 10 is a top view illustrating a modification example of the semiconductor device according to the second embodiment of the present invention. The trench wiring 13 is arranged in a mesh form. This reduces the resistance of the trench wiring 13, and can thereby suppress the concentration of current.

Third Embodiment

Figure 11:
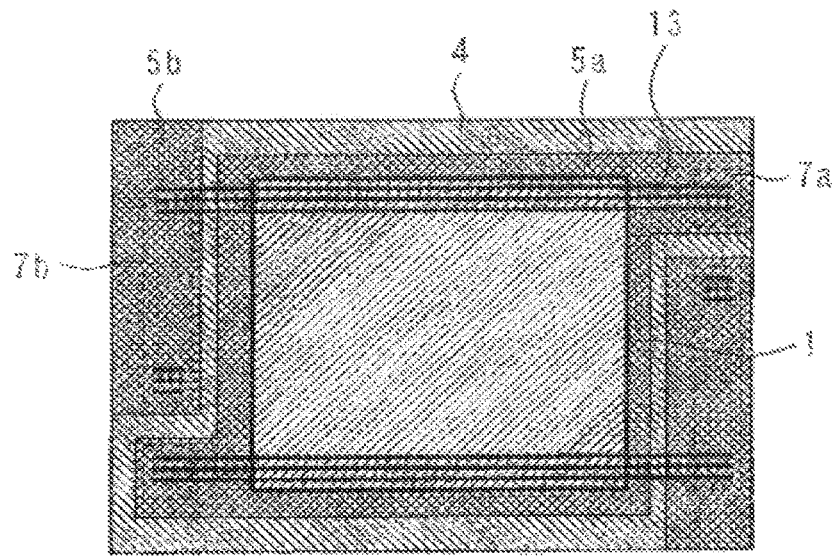
FIG. 11 is a top view illustrating a semiconductor device according to a third embodiment of the present invention.

FIG. 11 is a top view illustrating a semiconductor device according to a third embodiment of the present invention. An aluminum wiring 5a has a gate pad 1 exposed from a protective film 4. A trench wiring 13 passes under the gate pad 1. This makes it possible to reduce the area of elements. The rest of the configuration is the same as that of the second embodiment and can also obtain effects similar to those of the second embodiment.

Figure 12:
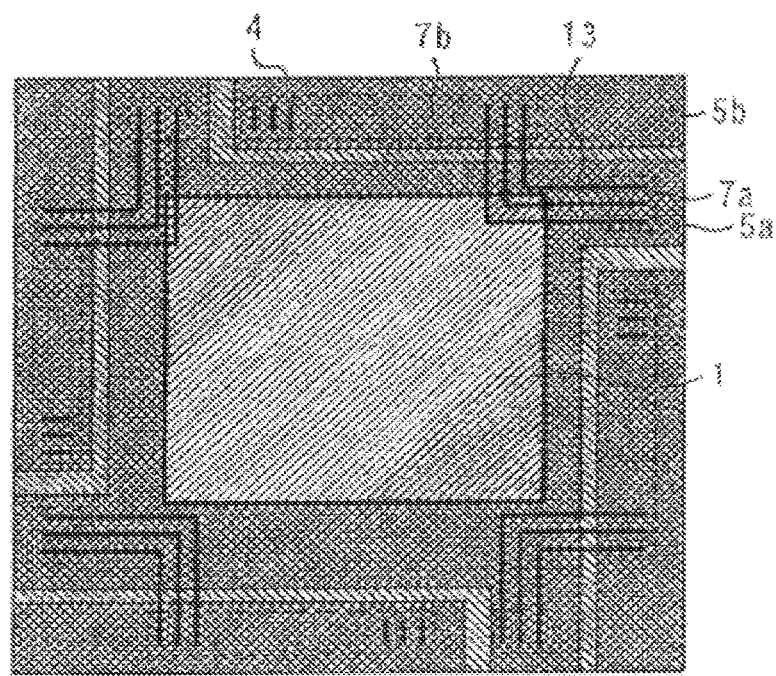
FIG. 12 is a top view illustrating a modification example 1 of the semiconductor device according to the third embodiment of the present invention.

FIG. 12 is a top view illustrating a modification example 1 of the semiconductor device according to the third embodiment of the present invention. The trench wiring 13 passes below a corner of the gate pad 1. This avoids the trench wiring 13 from passing right below the gate pad 1, and can thereby suppress influences of damage or the like. Furthermore, since the trench wiring 13 becomes shorter, the resistance of the trench wiring 13 can be reduced.

Figure 13:
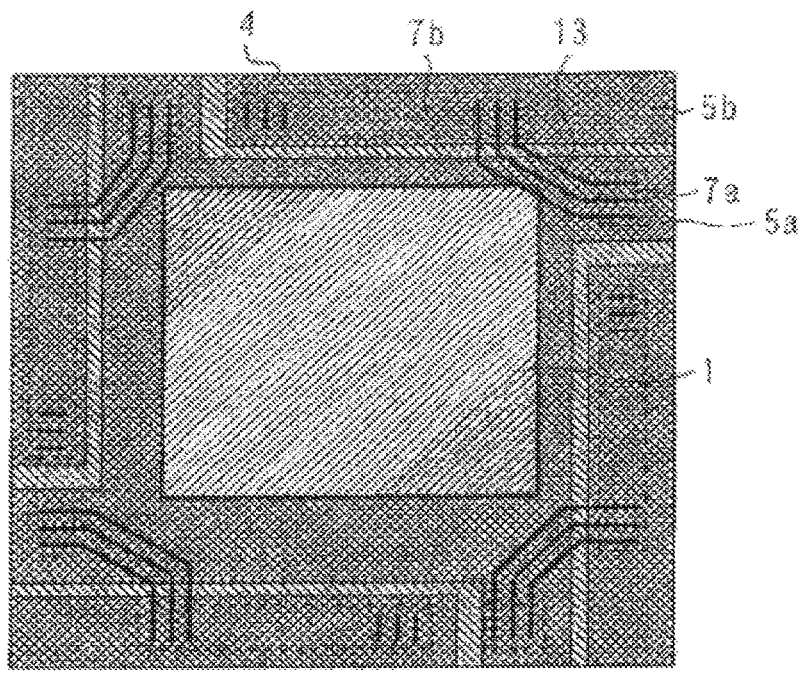
FIG. 13 is a top view illustrating a modification example 2 of the semiconductor device according to the third embodiment of the present invention.

FIG. 13 is a top view illustrating a modification example 2 of the semiconductor device according to the third embodiment of the present invention. The trench wiring 13 is disposed diagonally with respect to the corner of the gate pad 1. This further shortens the trench wiring 13, and can thereby further reduce the resistance of the trench wiring 13.

Figure 14:
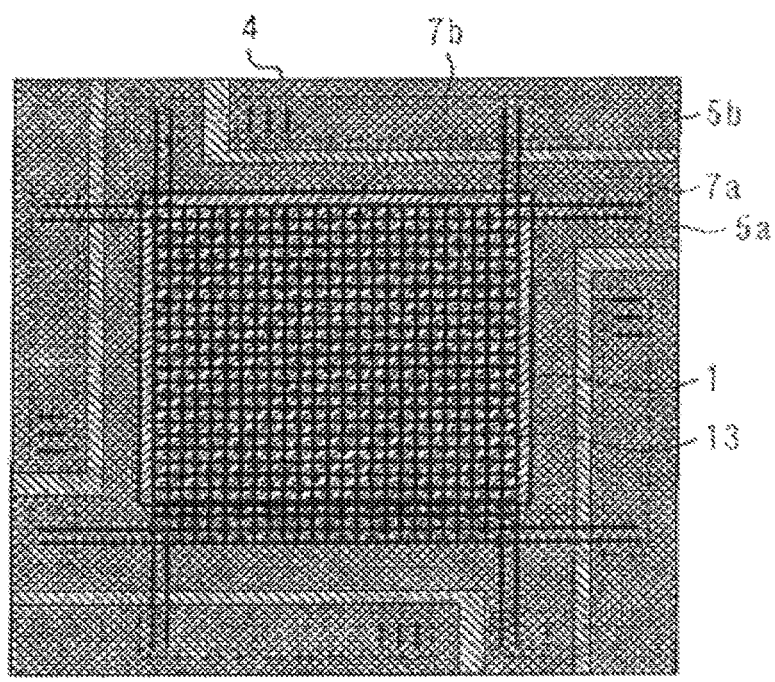
FIG. 14 is a top view illustrating a modification example 3 of the semiconductor device according to the third embodiment of the present invention.

FIG. 14 is a top view illustrating a modification example 3 of the semiconductor device according to the third embodiment of the present invention. The trench wiring 13 is arranged in a mesh form below the gate pad 1. Since the area of the gate pad 1 is large, many trench wirings 13 can be arranged. This causes the resistance of the trench wiring 13 to be reduced to a negligible level, and can thereby suppress the concentration of current.

In the semiconductor device according to the second and third embodiments, as in the case of the first embodiment, the semi-insulating protective film 4 may not be provided in a region right above the gate resistor 7 and between the aluminum wiring 5a and the aluminum wiring 5b. This can further improve insulation resistance.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-068214, filed on Mar. 25, 2011 including specification, claims, drawings and summary, on which the Convention priority of the present application is based, are incorporated herein by reference in its entirety.

What is claimed is:

1. A semiconductor device comprising:
   a substrate;
   first and second lower wirings on the substrate;
   an inter-layer insulating film covering the first and second lower wirings;
   first and second upper wirings on the inter-layer insulating film and separated from each other;
   a trench wiring on the substrate below a region between the first upper wiring and the second upper wiring and connecting the first lower wiring and the second lower wiring; and
   a semi-insulating protective film covering the first and second upper wirings.

2. The semiconductor device according to claim 1, wherein the first upper wiring has a wire bonding area exposed from the protective film, and the trench wiring passes below the wire bonding area.

3. The semiconductor device according to claim 2, wherein the trench wiring passes below a corner of the wire bonding area.

4. The semiconductor device according to claim 3, wherein the trench wiring is disposed diagonally with respect to the corner of the wire bonding area.

5. The semiconductor device according to claim 1, wherein the trench wiring is arranged in a mesh form.

* * * * *